United States Patent
Mahajani

(10) Patent No.: US 8,361,910 B2
(45) Date of Patent: *Jan. 29, 2013

(54) PRETREATMENT PROCESSES WITHIN A BATCH ALD REACTOR

(75) Inventor: Maitreyee Mahajani, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 13/174,705

(22) Filed: Jun. 30, 2011

(65) Prior Publication Data

US 2011/0263137 A1  Oct. 27, 2011

Related U.S. Application Data

(63) Continuation of application No. 12/163,876, filed on Jun. 27, 2008, now Pat. No. 7,972,978, which is a continuation of application No. 11/213,161, filed on Aug. 26, 2005, now Pat. No. 7,402,534.

(51) Int. Cl.
H01L 21/31 (2006.01)
H01L 21/469 (2006.01)

(52) U.S. Cl. .... 438/785; 438/758; 438/778; 257/E21.24

(58) Field of Classification Search ................ 438/758, 438/778, 785; 257/E21.24
See application file for complete search history.

(56) References Cited

U.S. PATENT DOCUMENTS

| 6,835,674 B2* | 12/2004 | Doan et al. ............... 438/791 |
| 7,135,422 B2* | 11/2006 | Nam et al. ............... 438/785 |
| 2003/0232501 A1* | 12/2003 | Kher et al. ............... 438/689 |
| 2005/0009371 A1* | 1/2005 | Metzner et al. ............ 438/785 |
| 2005/0170566 A1* | 8/2005 | Lee et al. ................. 438/149 |
| 2005/0271813 A1* | 12/2005 | Kher et al. ............ 427/248.1 |
| 2006/0292873 A1* | 12/2006 | Millward et al. .......... 438/681 |

* cited by examiner

*Primary Examiner* — Angel Roman
(74) *Attorney, Agent, or Firm* — Patterson & Sheridan, LLP

(57) ABSTRACT

Embodiments of the invention provide methods for forming dielectric materials on a substrate. In one embodiment, a method includes exposing a substrate surface to a first oxidizing gas during a pretreatment process, wherein the first oxidizing gas contains a mixture of ozone and oxygen having an ozone concentration within a range from about 1 atomic percent to about 50 atomic percent and forming a hafnium-containing material on the substrate surface by exposing the substrate surface sequentially to a deposition gas and a second oxidizing gas during an atomic layer deposition (ALD) process, wherein the deposition gas contains a hafnium precursor, the second oxidizing gas contains water, and the hafnium-containing material has a thickness within a range from about 5 Å to about 300 Å. In one example, the hafnium-containing material contains hafnium oxide having the chemical formula of $HfO_x$, whereas x is less than 2, such as about 1.8.

20 Claims, 1 Drawing Sheet

PRETREATMENT PROCESSES WITHIN A BATCH ALD REACTOR

CROSS-REFERENCE TO RELATED APPLICATIONS

This application is a continuation of U.S. Ser. No. 12/163,876 (APPM/010038.C1), filed Jun. 27, 2008, and issued as U.S. Pat. No. 7,972,978, which is a continuation of U.S. Ser. No. 11/213,161 (APPM/010038), filed Aug. 26, 2005, and issued as U.S. Pat. No. 7,402,534, which are herein incorporated by reference in their entirety.

BACKGROUND OF THE INVENTION

1. Field of the Invention

Embodiments of the invention generally relate to fabrication processes, and more specifically, for treatment processes and deposition processes while forming a material on a substrate.

2. Description of the Related Art

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive. Feature sizes of about 45 nm or smaller and aspect ratios of 10, 20, 30 or greater are more frequently desired during fabrication processes. While conventional chemical vapor deposition (CVD) processes have proved successful, aggressive device geometries require an alternative deposition technique, such as atomic layer deposition (ALD). During an ALD process, chemical precursors or reactant gases are sequentially introduced into a process chamber containing a substrate. Generally, a first precursor gas is administered into the process chamber and is adsorbed onto the substrate surface. A second precursor gas is administered into the process chamber and reacts with the first precursor to form a deposited material. A purge step is typically carried out between the delivery of each precursor gas and may be a continuous purge with a carrier gas or a pulse purge between the delivery of the precursor gases.

Atomic layer deposition processes have been successfully implemented for depositing dielectric layers, barrier layers and conductive layers. Dielectric materials deposited by ALD processes for gate and capacitor applications include hafnium oxide, hafnium silicate, zirconium oxide and tantalum oxide. Generally, an ALD process provides a deposited material with lower impurities and better conformality and control of film thickness when compared to a CVD process. However, an ALD process usually has a slower deposition rate than a comparable CVD process for depositing a material of similar composition. Therefore, an ALD process that reduces the overall fabrication throughput may be less attractive than the comparable CVD process. By utilizing a batch tool, productivity may be improved without sacrificing the benefits provided by ALD processes.

A batch deposition process may be used to maintain or increase throughput during a fabrication process by simultaneously processing multiple substrates within a single chamber. However, batch processes using CVD techniques remain limited due to the smaller geometries of modern devices. Current batch deposition processes utilizing ALD techniques may have an incubation delay prior to the onset of a constant deposition rate. The incubation delay may be attributed to a homogenous terminated surface of functional groups, such as hydrides, hydroxides, silicides and the like. Also, current ALD batch deposition processes may form high levels of particulates and other contaminants that end-up on the substrate surface. Contaminated surfaces may further increase incubation delay, as well as cause defects within the deposited material that lead to poor device performance.

Therefore, there is a need for a deposition process to decrease the incubation delay and reduce contaminants on a substrate surface prior to depositing a material, preferably, a hafnium oxide material during an ALD batch process.

SUMMARY OF THE INVENTION

In one embodiment of the invention, a method for forming a material on a substrate is provided which includes exposing a plurality of substrates within a batch process chamber to a pretreatment process and exposing the substrates sequentially to a hafnium precursor gas and a second precursor gas to form a hafnium-containing layer during an ALD cycle. The ALD cycle may be repeated until the hafnium-containing layer is deposited to a predetermined thickness on the substrates.

In another embodiment of the invention, a method for forming a hafnium material on a substrate is provided which includes exposing a plurality of substrates within a batch process chamber to a first oxidizing gas during a pretreatment process, exposing the substrates sequentially to a second oxidizing gas and a process gas containing a hafnium precursor during an ALD cycle and repeating the ALD cycle to form a hafnium-containing material. In one example, the first and second oxidizing gases are the same oxidizing gases. In a preferred example, the first and second oxidizing gases are different oxidizing gases. In an alternative example, the process gas may further contain a silicon precursor or an aluminum precursor, either pre-mixed or co-flowed into the process chamber.

The deposited hafnium-containing layer generally contains hafnium oxide, but may also contain hafnium silicate, hafnium aluminate, hafnium silicon aluminate or the like. In one example, the process gas containing a hafnium precursor and may contain an additional precursor, such as a silicon precursor or an aluminum precursor. In another example, an additional ALD cycle for forming a silicon oxide material and/or an aluminum oxide material may be sequentially altered with an ALD cycle for forming the hafnium oxide.

The pretreatment processes and the ALD processes described herein may be conducted within a single substrate process chamber. Preferably, the pretreatment processes and the ALD processes are conducted within a batch process chamber containing a plurality of substrates, such as 25 substrates, 50 substrates or 100 substrates. The pretreatment process may last for a time period within a range from about 1 second to about 60 minutes. In one example, the pretreatment process may last for a time period within a range from about 1 second to about 10 minutes. In another example, the pretreatment process may last for a time period within a range from about 10 minutes to about 60 minutes.

The first oxidizing gas and the second oxidizing gas may independently contain an oxygen source, such as oxygen, ozone, atomic-oxygen, water, hydrogen peroxide, nitrous oxide, nitric oxide, derivatives thereof or combinations thereof. In one example, the first oxidizing gas contains ozone and the second oxidizing gas contains water. In another example, the first oxidizing gas contains water and the second oxidizing gas contains ozone. In one example, the oxidizing gas contains an ozone/oxygen ($O_3/O_2$) mixture, such that the ozone is at a concentration within a range from about 1 atomic percent (at %) to about 50 at %, preferably, from about 5 at % to about 30 at %, and more preferably, from about 10 at % to about 20 at %. In another example, the oxidizing gas contains water vapor formed from an oxygen source and a hydrogen source produced by a catalytic water vapor generator.

In another embodiment of the invention, a method for forming a hafnium material on a substrate is provided which includes exposing a plurality of substrates within a batch process chamber to a first oxidizing gas for a predetermined during a pretreatment process time and subsequently conducting an ALD process to form a hafnium-containing layer. During the ALD process, an ALD cycle is repeated to expose the substrates to a hafnium precursor for a time period of at least 30 seconds, expose the batch process chamber to a first purge process, expose the substrates to a second oxidizing gas for a time period of at least 30 seconds and expose the batch process chamber to a second purge process. In one example, the substrates are exposed to the hafnium precursor for a time period within a range from about 30 seconds to about 90 seconds and to the second oxidizing gas for a time period within a range from about 30 seconds to about 90 seconds.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawing. It is to be noted, however, that the appended drawing illustrates only typical embodiments of the invention and is therefore not to be considered limiting of its scope, for the invention may admit to other equally effective embodiments.

DETAILED DESCRIPTION

Figure 1:
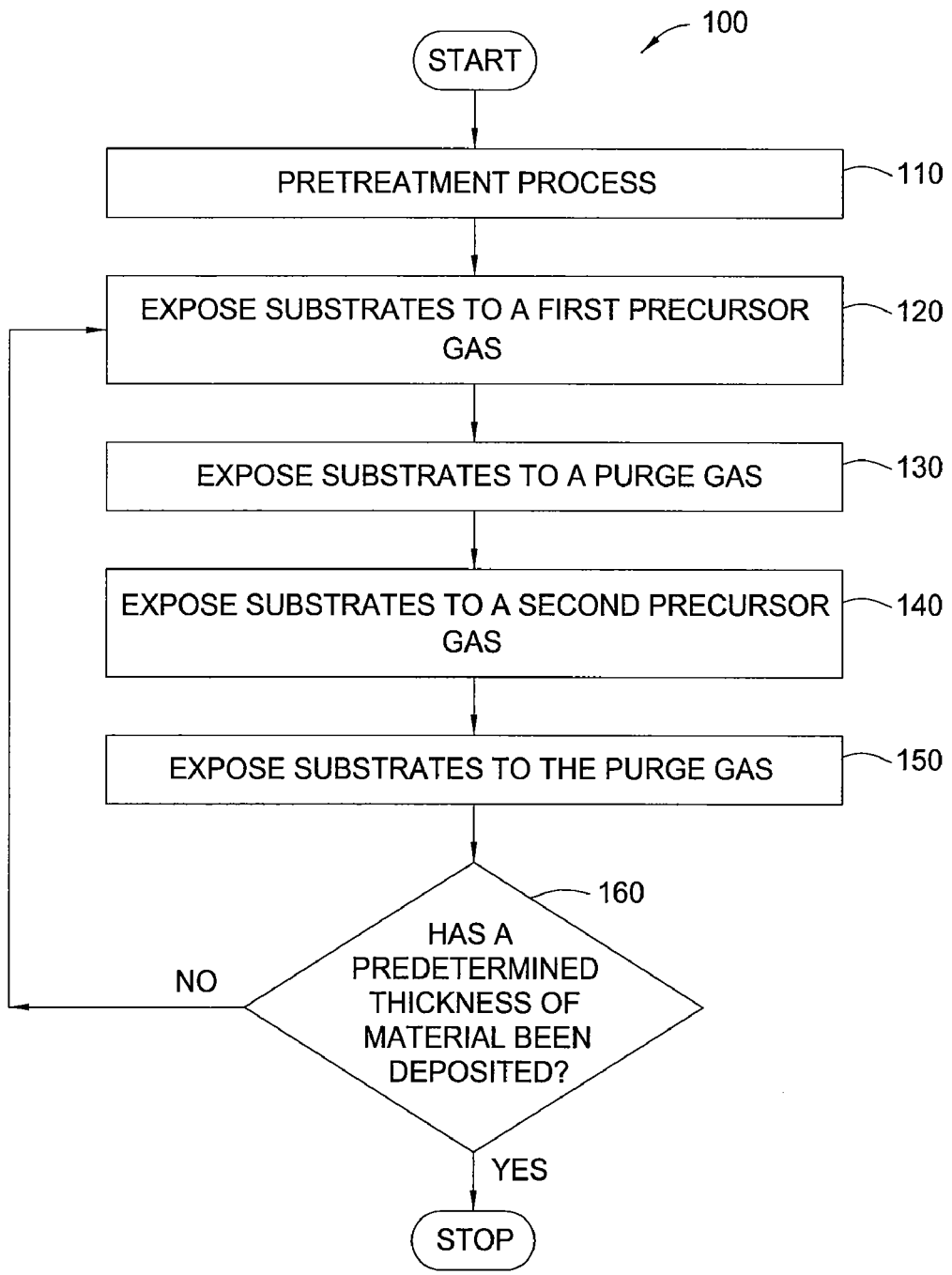
FIG. 1 illustrates a process sequence according to an embodiment described herein.

Embodiments of the invention provide methods for preparing materials used in a variety of applications, especially for high-k dielectric materials and barrier materials used in transistor and capacitor fabrication. The methods include pretreatment processes for substrates prior to conducting a chemical vapor deposition process, such as an atomic layer deposition (ALD) process or a chemical vapor deposition (CVD) process. In a preferred embodiment, an ALD process may be used to control elemental composition of the deposited materials. The pretreatment process and the vapor deposition process may be conducted within a single substrate process chamber, but preferably, the processes are conducted within a batch process chamber containing a plurality of substrates (e.g., 25, 50, 100 or more).

In FIG. 1, a flow chart depicts process 100 as described in one embodiment herein. Process 100 provides exposing substrates to a pretreatment process (step 110), to a first precursor (step 120), to a purge gas (step 130), to a second precursor (step 140) and again to the purge gas (step 150). An ALD cycle (steps 120, 130, 140 and 150) may be repeated to form the deposited material with a predetermined thickness (step 160). In one example, a pretreatment process contains a first oxidizing gas, the first precursor is a hafnium precursor and the second precursor is a second oxidizing gas.

The substrates may be exposed to one or multiple pretreatment processes during step 110. The pretreatment process may be conducted in a mini-batch process chamber maintained at a pressure within a range from about 1 mTorr to about 100 Torr, preferably, from about 10 mTorr to about 50 Torr, and more preferably, from about 5 Torr to about 10 Torr, such as about 8 Torr. The substrates are heated to a temperature within a range from about 70° C. to about 800° C., preferably, from about 100° C. to about 500° C., and more preferably, from about 200° C. to about 400° C.

The pretreatment process may expose the substrate surface to a treatment gas for a time period within a range from about 1 second to about 90 minutes, preferably from about 30 seconds to about 60 minutes, and more preferably from about 1 minute to about 40 minutes. In one example, the pretreatment process lasts for a time period within a range from about 1 second to about 60 seconds. In another example, the pretreatment process lasts for a time period within a range from about 1 minute to about 20 minutes. In another example, the pretreatment process lasts for a time period within a range from about 20 minutes to about 40 minutes. A pretreatment gas may be introduced into the process chamber during the pretreatment process at a rate within a range from about 100 standard cubic centimeters per minute (sccm) to about 5 standard liters per minute (slm), preferably, from about 500 sccm to about 4 slm, and more preferably, from about 1 slm to about 3 slm. The pretreatment gas forms a functional group that generally provides a base for an incoming chemical precursor to attach on the substrate surface. The substrates may be terminated with a variety of functional groups after being exposed to the pretreatment process. Functional groups that may be formed include hydroxyls (OH), alkoxy (OR, where R=Me, Et, Pr or Bu), oxygen radicals and aminos (NR or $NR_2$, where R=H, Me, Et, Pr or Bu), preferably, hydroxyls groups are formed on the substrate surface.

A pretreatment gas used during the pretreatment process preferably contains an oxidizing gas, but may contain an alternative reagent. Therefore, an oxidizing gas that may be used as a pretreatment gas includes oxygen ($O_2$), ozone ($O_3$), atomic-oxygen (O), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), derivatives thereof or combinations thereof. In another embodiment, the pretreatment gas may contain an alternative reagent that includes ammonia ($NH_3$), diborane ($B_2H_6$), silane ($SiH_4$), disilane ($Si_2H_6$), hydrogen ($H_2$), atomic-H, atomic-N, alcohols, amines, derivatives thereof or combination thereof. In an alternative embodiment, a pretreatment gas may contain a combination of an oxidizing gas and an alternative reagent. In a preferred example, an oxidizing gas is an ozone/oxygen ($O_3/O_2$) mixture, such that the ozone is at a concentration within a range form about 1 atomic percent (at %) to about 50 at %, preferably, from about 5 at % to about 30 at %, and more preferably, from about 10 at % to about 20 at %.

In one example of a pretreatment process, the substrates are exposed to an oxidizing gas containing water vapor generated from the water vapor generator (WVG) system containing a catalyst. The pretreatment process provides the substrate surface with hydroxyl terminated functional groups that react with precursors containing amino-type ligands (e.g., TDEAH, TDMAH, TDMAS or Tris-DMAS) during a subsequent exposure (e.g., step 120). Pretreatment processes and deposition processes that utilize a WVG system and may be used herein are further described in commonly assigned and U.S. Ser. No. 11/127,767, filed May 12, 2005, entitled, "Apparatuses and Methods for Atomic Layer Deposition of Hafnium-containing High-K Materials," and published as US 2005-0271813, which is incorporated herein by reference in its entirety. Additional pretreatment processes, pre-soak steps and deposition processes that may be used herein are further described in commonly assigned U.S. Pat. No. 6,858,547, and in commonly assigned U.S. Ser. No. 10/302,752, filed Nov. 21, 2002, entitled, "Surface Pre-Treatment for Enhancement of Nucleation of High Dielectric Constant Materials," and published as US 2003-0232501, which are incorporated herein by reference in their entirety.

In one embodiment, the substrates are exposed to a first oxidizing gas during the pretreatment process and to a second oxidizing gas during the deposition process, such that the first and the second oxidizing gases may be the same or different oxidizing gases. In a preferred example, the pretreatment process and the deposition process utilizes different oxidizing gases. Therefore, the first oxidizing gas may provide a preferred functionalized pretreated substrate surface while the second oxidizing gas may be a preferred oxidant during the subsequent vapor deposition process. In one example, the first oxidizing gas contains ozone and the second oxidizing gas contains water. In another example, the first oxidizing gas contains water and the second oxidizing gas contains ozone.

After the substrates have been exposed to a pretreatment process, a material may be deposited during a vapor deposition process, such as an ALD process or a CVD process and may include a plasma-enhanced ALD (PE-ALD) process, a plasma-enhanced CVD (PE-CVD) process, a pulsed CVD process or combinations thereof. In one example, the substrates are sequentially exposed to a metal precursor and an oxidizing gas to form a metal oxide material during an ALD process. In another example, the substrates are sequentially exposed to a metal precursor, an oxidizing gas, a silicon precursor and the oxidizing gas to form a metal silicate material during an ALD process. In another example, the substrates are sequentially exposed to a precursor mixture and an oxidizing gas during an ALD process to form materials containing at least three elements, such as a metal silicate material or a metal aluminate material. Examples of a precursor mixture include a combined mixture of a hafnium precursor and a silicon precursor or a hafnium precursor and an aluminum precursor.

The material deposited during the deposition step may be a dielectric material, a barrier material, a conductive material, a nucleation/seed material or an adhesion material. In one embodiment, the deposited material may be a dielectric material containing oxygen and/or nitrogen and at least one additional element, such as hafnium, silicon, tantalum, titanium, aluminum, zirconium, lanthanum or combinations thereof. For example, the dielectric material may contain hafnium oxide, zirconium oxide, tantalum oxide, aluminum oxide, lanthanum oxide, titanium oxide, silicon oxide, silicon nitride, oxynitrides thereof (e.g., $HfO_xN_y$), silicates thereof (e.g., $HfSi_xO_y$), aluminates thereof (e.g., $HfAl_xO_y$), silicon oxynitrides thereof (e.g., $HfSi_xO_yN_z$), derivatives thereof or combinations thereof. The dielectric material may also contain multiple layers of varying compositions. For example, a laminate film may be formed by depositing a silicon oxide layer onto a hafnium oxide layer to form a hafnium silicate material. A third layer of aluminum oxide may be deposited on the hafnium silicate to further provide a hafnium aluminum silicate material.

In one example of process 100, an ALD process is used to form a hafnium-containing material. The ALD process may be conducted in a mini-batch process chamber maintained at a pressure within a range from about 1 mTorr to about 100 Torr, preferably, from about 10 mTorr to about 10 Torr, and more preferably, from about 5 Torr to about 10 Torr, such as about 8 Torr. The substrates may be heated to a temperature within a range from about 70° C. to about 800° C., preferably, from about 100° C. to about 500° C., and more preferably, from about 200° C. to about 400° C.

A first precursor (e.g., hafnium precursor) may be introduced into the process chamber at a rate within a range from about 100 sccm to about 5 slm, preferably, from about 100 sccm to about 4 slm, and more preferably, from about 100 sccm to about 3 slm (step 120). A carrier gas may be provided with the first precursor and include nitrogen, argon, helium, hydrogen or combinations thereof. The first precursor may be introduced into the process chamber for a time period within a range from about 1 second to about 5 minutes, preferably, from about 5 seconds to about 2 minutes, and more preferably, from about 10 seconds to about 90 seconds. In one example, the first precursor is a hafnium precursor, such as a hafnium halide (e.g., $HfCl_4$) or a hafnium amino compound. Hafnium amino compounds are preferably tetrakis(dialkylamino)hafnium compounds that include tetrakis(diethylamino)hafnium (($Et_2N)_4Hf$ or TDEAH), tetrakis(dimethylamino)hafnium (($Me_2N)_4Hf$ or TDMAH) or tetrakis(ethylmethylamino)hafnium (($EtMeN)_4Hf$ or TEMAH).

A second precursor (e.g., an oxidizing gas) may be introduced into the process chamber at a rate within a range from about 100 sccm to about 5 slm, preferably, from about 500 sccm to about 4 slm, and more preferably, from about 1 slm to about 3 slm (step 140). The second precursor may be provided with a carrier gas and introduced into the process chamber for a time period within a range from about 1 second to about 5 minutes, preferably, from about 1 second to about 2 minutes, and more preferably, from about 1 second to about 90 seconds. In one example, the second precursor is an oxidizing gas, such as oxygen ($O_2$), ozone ($O_3$), atomic-oxygen (O), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), derivatives thereof or combinations thereof. In a preferred example, an oxidizing gas contains an ozone/oxygen ($O_3/O_2$) mixture, such that the ozone is at a concentration within a range form about 1 atomic percent (at %) to about 50 at %, preferably, from about 5 at % to about 30 at %, and more preferably, from about 10 at % to about 20 at %.

A purge gas (e.g., argon or nitrogen) is typically introduced into the process chamber at a rate within a range from about 100 sccm to about 5 slm, preferably, from about 500 sccm to about 4 slm, and more preferably, from about 1 slm to about 3 slm (steps 130 and 150). The purge gas helps remove any excess chemical precursors, by-products and contaminants from the substrates and the process chamber. The purge gas may be introduced for a time period within a range from about 1 second to about 5 minutes, preferably, from about 1 second to about 2 minutes, and more preferably, from about 1 second to about 90 seconds. Suitable carrier gases or purge gases may include argon, nitrogen, helium, hydrogen, forming gas or combinations thereof.

In one embodiment, an evacuation step may be conducted after the pretreatment step (step 110) and after each ALD step (steps 120, 130, 140 and 150). The process chamber is at least partially evacuated during the evacuation step, if not substantially or completely evacuated of gases. The evacuation step may last for a time period within a range from about 1 second to about 5 minutes, preferably, from about 1 second to about 2 minutes, and more preferably, from about 1 second to about 60 seconds. The process chamber may be evacuated to have a pressure within a range from about 100 mTorr to about 5 Torr, such as about 200 mTorr.

Each ALD cycle (steps 120 through 160) forms a layer of a material (e.g., hafnium oxide) on the substrates. Usually, each deposition cycle forms a layer having a thickness within a range from about 0.1 Å to about 10 Å. Depending on specific device requirements, subsequent deposition cycles may be needed to deposit the material having a desired thickness (step 160). As such, a deposition cycle (steps 120 through 160) may be repeated to achieve the predetermined thickness of the material.

In one example, a hafnium oxide material is deposited onto the substrates within a batch ALD process chamber. The substrates are exposed to a pretreatment process containing an oxidizing gas (e.g., $O_3$ or $H_2O$) introduced into the process chamber for a time period within a range from about 1 second to about 40 minutes (step 110). During an ALD cycle, the substrates are exposed to a first precursor (e.g., hafnium precursor) introduced into the process chamber alone or in combination with a carrier gas for a time period within a range from about 10 seconds to about 90 seconds (step 120). Next, a purge gas is introduced into the process chamber for a time period within a range from about 10 seconds to about 60 seconds (step 130) to purge or otherwise remove any residual precursor or by-products. Subsequently, the substrate is exposed to a second precursor (e.g., $O_3$ or $H_2O$) introduced into the process chamber alone or in combination with a carrier gas for a time period within a range from about 10 seconds to about 90 seconds (step 140). Thereafter, the purge gas is again administered into the process chamber for a time period within a range from about 10 seconds to about 60 seconds (step 150).

In one embodiment, hydrogen gas or a forming gas may be used as a carrier gas, purge and/or a reactant gas to reduce halogen contamination from the deposited materials. Precursors that contain halogen atoms (e.g., $HfCl_4$, $SiCl_4$ or $Si_2Cl_6$) readily contaminate the deposited materials. Hydrogen is a reductant and produces hydrogen halides (e.g., HCl) as a volatile and removable by-product. Therefore, hydrogen may be used as a carrier gas or a reactant gas when combined with a precursor compound (e.g., hafnium, silicon, oxygen precursors) and may include another carrier gas (e.g., Ar or $N_2$).

Exemplary hafnium precursors useful for depositing hafnium-containing materials may contain ligands such as halides, alkylaminos, cyclopentadienyls, alkyls, alkoxides, derivatives thereof or combinations thereof. Hafnium halide compounds useful as hafnium precursors may include $HfCl_4$, $HfI_4$, and $HfBr_4$. Hafnium alkylamino compounds useful as hafnium precursors include $(RR'N)_4Hf$, where R or R' are independently hydrogen, methyl, ethyl, propyl or butyl. Hafnium precursors useful for depositing hafnium-containing materials as described herein include $(Et_2N)_4Hf$ (TDEAH), $(Me_2)_4Hf$ (TDMAH), $(EtMeN)_4Hf$ (TEMAH), $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HfMe_2$, $(acac)_4Hf$, $(hfac)_4Hf$, $(tfac)_4Hf$, $(thd)_4Hf$, $(NO_3)_4Hf$, $(^tBuO)_4Hf$, $(^iPrO)_4Hf$, $(EtO)_4Hf$, $(MeO)_4Hf$ or derivatives thereof. Preferably, hafnium precursors used during the deposition process herein include $HfCl_4$, TDEAH, TDMAH and TEMAH.

Exemplary silicon precursors useful for depositing silicon-containing materials (e.g., silicates) include silanes, alkylaminosilanes, silanols or alkoxy silanes. Silicon precursors may include $(Me_2N)_4Si$, $(Me_2N)_3SiH$, $(Me_2N)_2SiH_2$, $(Me_2N)SiH_3$, $(Et_2N)_4Si$, $(Et_2N)_3SiH$, $(MeEtN)_4Si$, $(MeEtN)_3SiH$, $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, $MeSi(OH)_3$, $Me_2Si(OH)_2$, $(MeO)_4Si$, $(EtO)_4Si$ or derivatives thereof. Other alkylaminosilane compounds useful as silicon precursors include $(RR'N)_4SiH_n$, where R or R' are independently hydrogen, methyl, ethyl, propyl or butyl and n=0-3. Other alkoxy silanes may be described by the generic chemical formula $(RO)_{4-n}SiL_n$, where R=methyl, ethyl, propyl or butyl and L=H, OH, F, Cl, Br or I and mixtures thereof. Preferably, silicon precursors used during deposition processes herein include $(Me_2N)_3SiH$, $(Et_2N)_3SiH$, $(Me_2N)_4Si$, $(Et_2N)_4Si$ or $SiH_4$. Exemplary nitrogen precursors may include ammonia ($NH_3$), nitrogen ($N_2$), hydrazines (e.g., $N_2H_4$ or $MeN_2H_3$), amines (e.g., $Me_3N$, $Me_2NH$ or $MeNH_2$), anilines (e.g., $C_6H_5NH_2$), organic azides (e.g., $MeN_3$ or $Me_3SiN_3$), inorganic azides (e.g., $NaN_3$ or $Cp_2CoN_3$), radical nitrogen compounds (e.g., $N_3$, $N_2$, N, NH or $NH_2$), derivatives thereof or combinations thereof. Radical nitrogen compounds may be produced by heat, hot-wires or plasma.

The materials formed by the deposition processes described herein may have a thickness within a range from about 5 Å to about 300 Å, preferably from, about 10 Å to about 200 Å, and more preferably from, about 20 Å to about 100 Å. In some examples, hafnium oxide may be deposited having a thickness within a range from about 10 Å to about 60 Å, preferably, from about 30 Å to about 40 Å. Throughout the examples, a hafnium oxide material is formed with an empirical chemical formula of $HfO_x$, where x is 2 or less. Hafnium oxide may have the molecular chemical formula of $HfO_2$, but by varying process conditions (e.g., timing, temperature or precursors), hafnium oxides may be formed with less oxidized hafnium, such as $HfO_{1.8}$.

Batch process chambers for conducting vapor deposition processes, such as atomic layer deposition (ALD) or conventional chemical vapor deposition (CVD), that may be used during embodiments described herein are available from Applied Materials, Inc., located in Santa Clara, Calif., and are further disclosed in commonly assigned U.S. Pat. Nos. 6,352,593; 6,321,680; and 7,393,561, and in commonly assigned U.S. Ser. No. 10/216,079, filed Aug. 9, 2002, entitled, "High Rate Deposition at Low Pressure in a Small Batch Reactor," and published as US 2003-0049372, which are incorporated herein by reference in their entirety for the purpose of describing apparatuses used during deposition processes. Single wafer ALD chambers that may be used by embodiments described herein are further disclosed in commonly assigned U.S. Pat. No. 6,916,398, and in commonly assigned U.S. Ser. No. 11/127,753, filed May 12, 2005, entitled, "Apparatuses and Methods for Atomic Layer Deposition of Hafnium-containing High-K Materials," and published as US 2005-0271812, which are both incorporated herein by reference in their entirety.

A "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Processes of the embodiments described herein may deposit hafnium-containing materials on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a post-treatment process to polish, etch, reduce, oxidize, hydroxylate, anneal and/or bake the substrate surface.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a process chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the process chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In another embodiment, a first precursor containing compound A, a second precursor containing compound B and a third precursor containing compound C are each separately pulsed into the process chamber. Alternatively, a pulse of a first precursor may overlap in time with a pulse of a second precursor while a pulse of a third precursor does not overlap in time with either pulse of the first and second precursors.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein is intended to refer to a pulse of precursor step followed by a purge step.

EXAMPLES

The hypothetical examples 1-4 may be conducted within an ALD batch process chamber, available from Applied Materials, Inc., located in Santa Clara, Calif., and mini-batch process chambers, as described in commonly assigned U.S. Pat. Nos. 6,352,593; 6,321,680; and 7,393,561, and in commonly assigned U.S. Ser. No. 10/216,079, filed Aug. 9, 2002, entitled, "High Rate Deposition at Low Pressure in a Small Batch Reactor," and published as US 2003-0049372, which are incorporated herein by reference in their entirety for the purpose of describing apparatuses to conduct the deposition processes.

Example 1

$HfO_2$ ($H_2O$-Soak/$O_3$-ALD)

A batch of 50 substrates is positioned on the susceptors of a boat within the mini-batch ALD chamber. The process chamber is maintained at a pressure of about 8 Torr at about 250° C. and exposed to a pretreatment gas containing water vapor for about 20 minutes. Thereafter, a hafnium oxide layer is formed during an ALD process by sequentially exposing the substrates to a hafnium precursor (TDMAH in nitrogen carrier gas) and ozone (15 at % ozone in oxygen). The substrates are heated to about 250° C. and exposed to a plurality of ALD cycles. Each ALD cycle includes flowing TDMAH into the chamber for about 30 seconds, evacuating the chamber for about 30 seconds, flowing nitrogen (purge gas) into the chamber for about 30 seconds, evacuating the chamber for about 30 seconds, flowing ozone into the chamber for about 30 seconds, evacuating the chamber for about 30 seconds, flowing nitrogen into the chamber for about 30 seconds and evacuating the chamber for about 30 seconds. The ALD cycle is repeated a total of 50 cycles to form a hafnium oxide layer with a thickness of about 80 Å.

Example 2

$HfO_2$ ($O_3$—Soak/$H_2O$-ALD)

A batch of 50 substrates is positioned on the susceptors of a boat within the mini-batch ALD chamber. The process chamber is maintained at a pressure of about 6 Torr at about 200° C. and exposed to a pretreatment gas containing ozone (15 at % ozone in oxygen) for about 5 minutes. Thereafter, a hafnium oxide layer is formed during an ALD process by sequentially exposing the substrates to a hafnium precursor (TDMAH in nitrogen carrier gas) and water vapor (in nitrogen carrier gas). The substrates are heated to about 200° C. and exposed to a plurality of ALD cycles. Each ALD cycle includes flowing TDMAH into the chamber for about 30 seconds, evacuating the chamber for about 30 seconds, flowing nitrogen (purge gas) into the chamber for about 30 seconds, evacuating the chamber for about 30 seconds, flowing water vapor into the chamber for about 30 seconds, evacuating the chamber for about 30 seconds, flowing nitrogen into the chamber for about 30 seconds and evacuating the chamber for about 30 seconds. The ALD cycle is repeated a total of 50 cycles to form a hafnium oxide layer with a thickness of about 80 Å.

Example 3

$HfSiO_4$ ($O_3$-Soak/$H_2O$-ALD)

A batch of 50 substrates is positioned on the susceptors of a boat within the mini-batch ALD chamber. The process chamber is maintained at a pressure of about 8 Torr at about 300° C. and exposed to a pretreatment gas containing ozone (15 at % ozone in oxygen) for about 10 minutes. Thereafter, a hafnium silicate layer is formed during an ALD process by sequentially exposing the substrates to a hafnium precursor (TDMAH in nitrogen carrier gas), water vapor, a silicon precursor (Tris-DMAS in nitrogen carrier gas) and water vapor. The substrates are heated to about 300° C. and exposed to a plurality of ALD cycles. Each ALD cycle includes flowing TDMAH into the chamber for about 30 seconds, evacuating the chamber for about 30 seconds, flowing nitrogen (purge gas) into the chamber for about 30 seconds, evacuating the chamber for about 30 seconds, flowing water vapor into the chamber for about 30 seconds, evacuating the chamber for about 30 seconds, flowing nitrogen into the chamber for about 30 seconds and evacuating the chamber for about 30 seconds, flowing Tris-DMAS into the chamber for about 30 seconds, evacuating the chamber for about 30 seconds, flowing nitrogen into the chamber for about 30 seconds, evacuating the chamber for about 30 seconds, flowing water vapor into the chamber for about 30 seconds, evacuating the chamber for about 30 seconds, flowing nitrogen into the chamber for about 30 seconds and evacuating the chamber for about 30 seconds. The ALD cycle is repeated a total of 50 cycles to form a hafnium silicate layer with a thickness of about 120 Å.

Example 4

HfSiO$_4$ (co-flow) (O$_3$-Soak/H$_2$O-ALD)

A batch of 50 substrates is positioned on the susceptors of a boat within the mini-batch ALD chamber. The process chamber is maintained at a pressure of about 8 Torr at about 300° C. and exposed to a pretreatment gas containing ozone (15 at % ozone in oxygen) for about 10 minutes. Thereafter, a hafnium silicate layer is formed during an ALD process by sequentially exposing the substrates to a hafnium/silicon precursor mixture (TDMAH/Tris-DMAS (1:1) in nitrogen carrier gas) and water vapor. The substrates are heated to about 300° C. and exposed to a plurality of ALD cycles. Each ALD cycle includes flowing the TDMAH/Tris-DMAS mixture into the chamber for about 30 seconds, evacuating the chamber for about 30 seconds, flowing nitrogen into the chamber for about 30 seconds, evacuating the chamber for about 30 seconds, flowing water into the chamber for about 30 seconds, evacuating the chamber for about 30 seconds, flowing nitrogen into the chamber for about 30 seconds and evacuating the chamber for about 30 seconds. The ALD cycle is repeated a total of 80 cycles to form a hafnium silicate layer with a thickness of about 100 Å.

While the foregoing is directed to embodiments of the present invention, other and further embodiments of the invention may be devised without departing from the basic scope thereof, and the scope thereof is determined by the claims that follow.

The invention claimed is:

1. A method for forming a dielectric material on a substrate, comprising:
exposing a substrate surface to a first oxidizing gas during a pretreatment process, wherein the first oxidizing gas comprises a mixture of ozone (O$_3$) and oxygen (O$_2$) having an ozone concentration within a range from about 1 atomic percent to about 50 atomic percent; and
forming a hafnium-containing material on the substrate surface by exposing the substrate surface sequentially to a deposition gas and a second oxidizing gas during an atomic layer deposition process, wherein the deposition gas comprises a hafnium precursor, the second oxidizing gas comprises water, and the hafnium-containing material has a thickness within a range from about 5 Å to about 300 Å.

2. The method of claim 1, wherein the hafnium-containing material comprises hafnium oxide having the chemical formula of HfO$_x$, whereas x is less than 2.

3. The method of claim 2, wherein the hafnium oxide has the chemical formula of HfO$_x$, whereas x is about 1.8.

4. The method of claim 1, wherein the hafnium precursor is selected from the group consisting of hafnium tetrachloride, tetrakis(diethylamino) hafnium, tetrakis(dimethylamino) hafnium, and tetrakis(ethylmethylamino) hafnium.

5. The method of claim 1, wherein the thickness of the hafnium-containing material is within a range from about 10 Å to about 200 Å.

6. The method of claim 5, wherein the thickness of the hafnium-containing material is within a range from about 20 Å to about 100 Å.

7. The method of claim 5, wherein the thickness of the hafnium-containing material is within a range from about 10 Å to about 60 Å.

8. The method of claim 1, wherein the deposition gas further comprises a silicon precursor and the hafnium-containing material comprises hafnium silicate.

9. A method for forming a dielectric material on a substrate, comprising:
exposing a substrate surface to a first oxidizing gas during a pretreatment process, wherein the first oxidizing gas comprises a mixture of ozone (O$_3$) and oxygen (O$_2$) having an ozone concentration within a range from about 1 atomic percent to about 50 atomic percent; and
forming a dielectric material on the substrate surface by exposing the substrate surface sequentially to a deposition gas and a second oxidizing gas during an atomic layer deposition process, wherein the second oxidizing gas comprises water and the dielectric material has a thickness within a range from about 5 Å to about 300 Å.

10. The method of claim 9, wherein the dielectric material comprises a material selected from the group consisting of hafnium oxide, zirconium oxide, lanthanum oxide, aluminum oxide, titanium oxide, tantalum oxide, silicon oxide, oxynitrides thereof, silicates thereof, aluminates thereof, silicon oxynitrides thereof, derivatives thereof, and combinations thereof.

11. The method of claim 9, wherein the dielectric material comprises hafnium oxide having the chemical formula of HfO$_x$, whereas x is less than 2.

12. The method of claim 11, wherein the hafnium oxide has the chemical formula of HfO$_x$, whereas x is about 1.8.

13. The method of claim 9, wherein the deposition gas comprises a hafnium precursor.

14. The method of claim 13, wherein the hafnium precursor is selected from the group consisting of hafnium tetrachloride, tetrakis(diethylamino) hafnium, tetrakis(dimethylamino) hafnium, and tetrakis(ethylmethylamino) hafnium.

15. The method of claim 13, wherein the deposition gas further comprises a silicon precursor and the dielectric material comprises hafnium silicate.

16. The method of claim 9, wherein the thickness of the dielectric material is within a range from about 10 Å to about 200 Å.

17. The method of claim 16, wherein the thickness of the dielectric material is within a range from about 20 Å to about 100 Å.

18. The method of claim 16, wherein the thickness of the dielectric material is within a range from about 10 Å to about 60 Å.

19. A method for forming a dielectric material on a substrate, comprising:
exposing a substrate surface to a first oxidizing gas during a pretreatment process, wherein the first oxidizing gas comprises a mixture of ozone (O$_3$) and oxygen (O$_2$); and
forming a hafnium-containing material on the substrate surface by exposing the substrate surface sequentially to a deposition gas and a second oxidizing gas during an atomic layer deposition process, wherein the deposition gas comprises a hafnium precursor, the second oxidizing gas comprises water, and the hafnium-containing material comprises hafnium oxide having the chemical formula of HfO$_x$, whereas x is less than 2.

20. The method of claim 19, wherein the hafnium oxide has the chemical formula of HfO$_x$, whereas x is about 1.8.

* * * * *